METHOD OF CONTROLLING DIFFUSION
Filed March 26, 1964
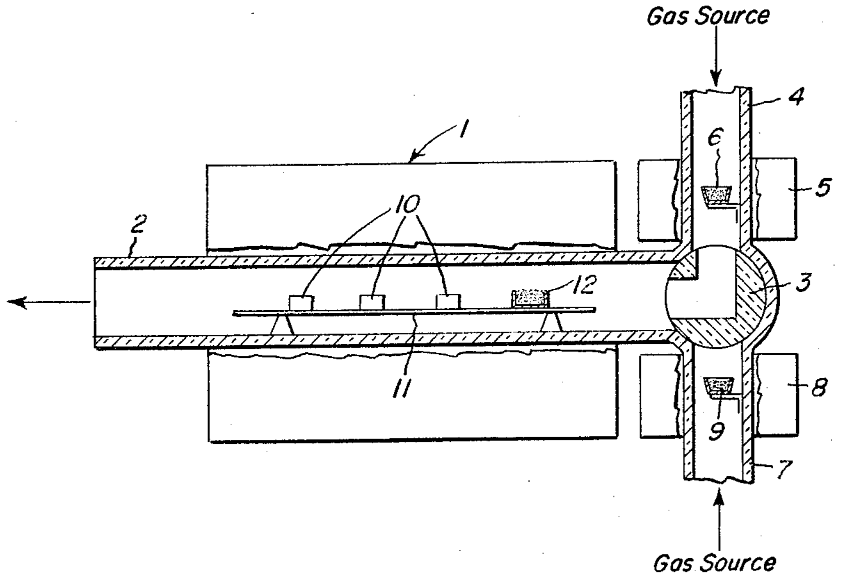
Inventor:
Henry H. Woodbury,
by John F. Ahern
His Attorney.

United States Patent Office 3,282,749

Patented Nov. 1, 1966

3,282,749

METHOD OF CONTROLLING DIFFUSION

Henry H. Woodbury, Schenectady, N.Y., assignor to General Electric Company, a corporation of New York

Filed Mar. 26, 1964, Ser. No. 354,838
4 Claims. (Cl. 148—189)

The present invention is directed to a method of controlling the rate of diffusion of doping impurities into senmiconductive crystals.

Compound semiconductors in crystalline form are currently finding varied application, including such devices as lasers, information recorders and display screens. These uses and many others arise out of their properties of semiconduction, photoconduction and electroluminescence, to name a few. In the preparation of such devices, it is necessary to dope the crystals with impurities so as to provide regions of different conductivity types and, particularly, junctions between such regions.

The preparation of such junctions by diffusion has proven to be a simple and inexpensive process. However, with present methods of diffusion, it is extremely difficult if not impossible to form such regions with sharp boundaries. For example, no control is presently known which will abruptly change the diffusion rate of an impurity while maintaining the semiconductor at a constant temperature. Nor is there a presently known method of changing the relative diffusion rates of two different impurities that could be used to prepare a junction. Without such a control, one is limited in the types of impurities that might be used and in the processing of the device in order to obtain a sharply defined junction between the regions containing the two impurities.

The present invention is therefore directed to a method of controlling diffusion which overcomes the difficulties described above.

Accordingly, it is an object of the present invention to provide a new and improved method of controlling the diffusion of impurities into semiconductive crystals.

A further object of the present invention is the provision of a new and improved method of precisely controlling the rate of diffusion of an impurity into a semiconductive crystal.

Another object of the present invention is the provision of a new and improved method of positively controlling the rate and depth of impurity diffusion into semiconductive crystals.

Finally, it is an object of the present invention to provide a new and improved method of distinguishably controlling the diffusion of different impurities into a semiconductive crystal.

Briefly, in accord with one aspect of the present invention, the diffusion of an impurity into a compound semiconductor crystal is carried out in an enclosure having a controllable atmosphere. The rate of diffusion of the impurity is adjustable by controlling the atmosphere. Specifically, impurities which substitute for one constituent of the compound have a different diffusion rate in an atmosphere containing a higher partial pressure of one constituent than in an atmosphere containing a high partial pressure of the other constituent of the compound. This invention comprises, therefore, controlling the respective partial pressures of these elements in the atmosphere.

In one particular embodiment, a p-n junction may be prepared in a compound crystal by the following steps: heating the crystal in a furnace, introducing a first impurity of one-conductivity inducing type which diffuses more rapidly an atmosphere containing a first constituent of said compound, providing an atmosphere containing the first constituent for a time sufficient to diffuse the first impurity a predetermined depth into the crystal, changing said atmosphere to one containing the second constituent of said compound, removing the first impurity and introducing a second impurity of opposing conductivity inducing type which diffuses more rapidly in an atmosphere containing the second constituent, and maintaining the second atmosphere for a time sufficient to diffuse the second impurity a sufficient depth into a crystal so as to create a junction with the first impurity.

The novel features believed characteristic of the invention are set forth in the appended claims. The invention itself, together with further objects and advantages thereof, may best be understood by reference to the following description taken in conjunction with the appended drawing which represents apparatus used in the performance of the present invention.

I have found that the diffusion of impurities into compound semiconductive crystals can be controlled by adjusting the atmosphere surrounding the crystal. More specifiically, the diffusion rate of such impurities depends strongly on the relative partial pressures of the respective elements of the compound in the atmosphere. Thus, the method of my invention controls the rate of diffusion, enabling introduction of a first impurity by diffusion and, when a given depth has been reached introduction of a second impurity by diffusion without substantially changing the depth of penetration of the first impurity. The positioning of the impurities may be controlled as desired so as, for example, to produce a p-n junction.

In carrying out the method of the present invention, apparatus such as that schematically illustrated in FIG. 1 may be used. In general, a crystal of the selected semiconductor material is placed in an enclosure with the impurity to be diffused therein and the two are heated in an atmosphere which presents a predetermined partial pressure of each of the constituents of the semiconductor compound. The partial pressure of each constituent may range from 0 to the maximum or saturation value at the temperature of heating.

The apparatus of FIG. 1, in which the above steps are accomplished, comprises a furnace 1 including a ceramic pipe 2 within which the heating takes place. The atmosphere within the furnace 1 is defined by the gas stream passing through pipe 2.

The gas stream in pipe 2 is controllable according to a predetermined schedule so as to properly control the diffusion of impurities into the crystals. As is schematically illustrated in FIG. 1, alternate gas sources controlled by a valve 3 are proved so that, if valve 3 is in the position shown, a stream of gas, either inert or active according to the requirements of the particular situation, passes through pipe 4 and furnace 5 into the furnace 1. Within furnace 5, a powered charge 6 of one of the constituents of the semiconductive compound is provided so that it may be heated and vaporized by the furnace 5 and the vapor may be picked up by the gas stream passing therethrough. This produces an atmosphere in furnace 1 which has a predetermined partial pressure of the constituent provided by charge 6. If the valve 3 is turned 90°, an identical system comprising a source of gas, a pipe 7, a furnace 8 and a charge 9 provides the gas stream to furnace 1. The charge 9 comprises the other constituent of the semiconductive compound to produce the desired partial pressure of that constituent.

In performing the method of the present invention, as many crystals 10 as may be conveniently accommodated within the furnace 1 are cut into disks or bodies approximately 2–4 millimeters in diameter or inside measurement and the crystals are cleaned, washed in distilled water, dried and placed on a tray 11. A charge 12 of the impurity to be diffused into the crystals is also placed on the tray which is then inserted into the furnace so that the impurity charge is adjacent the inlet end. Alternatively, the impurity may be plated onto the crystals. The furnace is then heated to bring the crystals and the impurity to a predetermined temperature and the valve 3 is set to introduce a gas which will enable the diffusion to proceed at a fast rate. When the diffusion has proceeded for a predetermined length of time, the valve 3 is reversed so as to change the atmosphere within the furnace. It has been found that the effect of such a change on the diffusion is very rapid compared to the rate of diffusion of the impurity. Since the diffusion is now proceeding at a much slower rate, the furnace can be cooled or the impurity charge 12 can be changed with essentially no change in the position of the impurity within the crystals.

Thus, it can be seen that a particular advantage of the present invention lies in the ease of controlling the rate of diffusion of an impurity by simply changing the constituents of the gas flowing through the furnace. As indicated, such control may be used to limit the diffusion of a first impurity during the diffusion of a second; or during cooling of the crystal; or for other purposes when it is desired to substantially reduce or eliminate diffusion of an impurity even though the crystal remains in a heated furnace.

The present invention is generally applicable to the diffusion of donor or acceptor impurities into compound semiconductive crystals. It has particular application in crystals comprising compounds of elements from groups II and VI of the Periodic Table. It has been found to be particularly difficult to produce p-n junctions in these compounds which include, for example, those comprising one of zinc or cadmium and one of sulfur, selenium or tellurium. Therefore, the present invention has notably greater utility as applied to these compounds.

It is not intended, however, to limit the method of this invention to these compounds. Other crystals, for example, those comprising III–V compounds such as gallium arsenide, are also intended to be included.

When the word "impurity" is used herein, it is intended to include all of those materials which act as donors or acceptors in the compound of the crystal in question. For example, Al, Ga and In act as donors in compounds including group II elements; Zn and Cd act as acceptors in compounds including group III elements; the halogens act as donors in compounds including group VI elements; and P, As, and Sb act as acceptors in compounds including group VI elements.

While it is not intended to limit the scope of the present invention to any particular theory, the following is proposed as a possible explanation of one of the results upon which the invention is predicated. In the case of CdTe in a Te atmosphere, impurities which substitute for the cadmium diffuse more rapidly than the same impurities would in a Cd atmosphere. It is suggested that, when an excess of Te is present in the atmosphere, the stoichiometry of the crystal is shifted due to Te vacancies being removed and Cd vacancies being created. It has been found that this occurs very rapidly as compared to other diffusion phenomena. Because of the increase in the number of Cd vacancies, an impurity which substitutes therefor will diffuse quickly into the crystal while one which does not so substitute will diffuse slowly.

The following specific examples are set forth, not in limitation of this invention, but in explanation and to further illustrate the applications and advantages thereof:

*Example 1*

(a) A crystal of CdTe is cut to a cube of usable size such as 2 mm. on a side and the surface is cleaned and rinsed in distilled water and dried. The crystal is then plated by evaporation with a thin layer of In, and is placed in a furnace and heated to a temperature of 700° C. in an atmosphere of Cd vapor for one hour. The crystal is cooled and the depth of penetration of the In is found to be $2\times10^{-3}$ cm.

(b) A crystal of CdTe is prepared, placed in a furnace and heated as described in (a). This is done in an atmosphere of Te vapor for one hour. The crystal is cooled and the depth of penetration is found to be $5\times10^{-4}$ cm.

Since the impurities which act as donors in cadmium compounds, for example Al, Ga and In, simply substitute for cadmium therein, the following examples involving radioactive cadmium diffused, under varying conditions, into crystals of cadmium sulfide are of interest for comparing the rates of diffusion of such impurities.

*Example 2*

A crystal of CdS is prepared and placed in a furnace as described in Example 1, omitting the plating step, and heated to 800° C. An atmosphere of saturated cadmium (a pressure of 1.4 atmospheres) is provided including, for purposes of analysis of the diffused layer, a sufficient percentage of radioactive cadmium. After maintaining the heat for several hours, the crystal is cooled and analyzed. The rate of diffusion is calculated, from several such measurements, to be $2\times10^{-9}$ cm.$^2$ per sec.

*Example 3*

A crystal of CdS is prepared and treated as described in Example 2 except that the atmosphere provided is saturated sulfur. The diffusing impurity is again radioactive Cd. From several such measurements, the rate of diffusion is calculated to be $2\times10^{-11}$ cm.$^2$ per sec.

*Example 4*

A crystal of CdS is prepared and treated as described in Example 3 except that the atmosphere provided includes cadmium at a partial pressure of $1.5\times10^{-3}$ atmospheres. From several such measurements, the rate of diffusion is calculated to be $10^{-10}$ cm.$^2$ per sec.

From these examples, the utility of the present invention in controlling the diffusion of impurities can be seen. Example 1 illustrates the control which can be achieved over the depth of diffusion. Examples 2–4, including calculations of the precise rates of diffusion, illustrate the variation of rate with atmosphere.

While I have shown and described several embodiments of my invention, it will be apparent to those skilled in the art that many changes and modifications may be made without departing from my invention in its broader aspects; and I therefore intend the appended claims to cover all such changes and modifications as fall within the true spirit and scope of my invention.

What I claim as new and desire to secure by Letters Patent of the United States is:

1. A method of controlling the rate of diffusion of an impurity in a semiconductive compound having a first component selected from the group consisting of zinc and cadmium and a second component selected from the group consisting of sulfur, selenium and tellurium which comprises the steps of preparing a crystal of said compound, placing said crystal and a quantity of said impurity in a furnace, heating said crystal and said impurity to an elevated temperature, providing an atmosphere in said furnace including first predetermined partial pressures of the respective elements of said compound, said partial pressures each lying between zero and the saturation value at said elevated temperature, so as to provide a predetermined rate of diffusion of said impurity, and maintaining said crystal, said impurity and said atmosphere at said elevated temperature for a time sufficient to diffuse a portion of said impurity a predetermined depth into said crystal and changing said atmosphere to provide second predetermined partial pressures of the respective elements of said compound so as to change said rate of diffusion.

2. A method of controlling the rate of diffusion of an impurity in a semiconductive compound as claimed in claim 1 wherein said compound comprises cadmium telluride.

3. A method of preparing a junction of opposing semiconductivity type regions in a compound semiconductive crystal having a first component selected from the group consisting of zinc and cadmium and a second component selected from the group consisting of sulfur, selenium and tellurium which comprises the steps of providing a crystal of said compound, placing said crystal in a furnace, heating said crystal to an elevated temperature, introducing a first impurity of a first conductivity type which diffuses more rapidly in an atmosphere containing one component of said compound than in an atmosphere containing the other component of said compound, providing an atmosphere containing the one component of said compound for a time sufficient to diffuse said first impurity a predetermined depth into said crystal compound, changing said atmosphere to one containing said other component of said compound, removing said first impurity and introducing a second impurity of opposing conductivity type which diffuses more rapidly in an atmosphere containing said other component of said compound than in an atmosphere containing said one component, and maintaining an atmosphere containing said other component for a time sufficient to diffuse said second impurity into said crystal beyond the depth of said first impurity to create the junction between the regions containing said first and said second impurities.

4. A method of forming a junction of opposing conductivity types in a compound semiconductive crystal claimed in claim 3 wherein said compound comprises cadmium telluride.

References Cited by the Examiner

UNITED STATES PATENTS

| | | | |
|---|---|---|---|
| 2,890,142 | 6/1959 | Korger | 148—189 |
| 2,978,617 | 4/1961 | Dorendorf | 148—189 |
| 3,079,287 | 2/1963 | Anderson | 148—186 |
| 3,196,058 | 7/1965 | Webster | 148—189 |

HYLAND BIZOT, *Primary Examiner.*